United States Patent [19]

Dalal

[11] Patent Number: 4,604,636

[45] Date of Patent: Aug. 5, 1986

[54] MICROCRYSTALLINE SEMICONDUCTOR METHOD AND DEVICES

[75] Inventor: Vikram L. Dalal, Lawrenceville, N.J.

[73] Assignee: Chronar Corp., Princeton, N.J.

[21] Appl. No.: 493,701

[22] Filed: May 11, 1983

[51] Int. Cl.[4] .............................................. H01L 45/00
[52] U.S. Cl. ......................................... 357/2; 357/30; 357/16; 357/61
[58] Field of Search .......................... 357/2, 30, 16, 61

[56] References Cited

U.S. PATENT DOCUMENTS 4,498,092 2/1985 Yamazaki ................................ 357/2

Primary Examiner—Martin H. Edlow
Attorney, Agent, or Firm—George E. Kersey

[57] ABSTRACT

The specification discloses a P-I-N device wherein a double heterojunction is provided by a body of intrinsic amorphous silicon sandwiched between two microcrystalline silicon layers.

7 Claims, 5 Drawing Figures

MICROCRYSTALLINE SEMICONDUCTOR METHOD AND DEVICES

BACKGROUND OF THE INVENTION

This invention relates to the production of microcrystalline semiconductors, particularly for use in semiconductor devices.

Semiconductors are useful in a wide variety of devices. Examples include memories, field effect, luminescent and thin film devices and displays.

Amorphous semiconductors, when hydrogenated, are particularly useful for photovoltaic devices which product a voltage when subjected to radiation, or radiate when electrically energized.

The first photovoltaic semiconductors were produced from relatively thick single crystals. Subsequently, amorphous material with suitable photosensitivity was fabricated by glow discharge in a gaseous atmosphere. The glow discharge process unfortunately produces defects in the resulting material by virtue of ion bombardment. Nevertheless, it was shown in 1972 that amorphous silicon could be produced by glow discharge from silane with lower defect density than anticipated by the use of controlled conditions. W. E. Spear and P. G. LeComber, J. Non-Cryst. Solids, 8–10, 727 (1972).

In 1975 Professor Spear and his co-workers demonstrated that wide ranging control over the electronic properties of glow discharge amorphous silicon could be achieved by doping with phosphorus and boron. Spear, et al., Solid-State Commun., 17, 1193, (1975).

In 1976 Carlson used glow discharge amorphous silicon to produce Schottky barrier and P-I-N junction devices. Carlson U.S. Pat. No. 4,064,521 (Dec. 20, 1977). The Carlson patent discusses P-I-N junctions with heavily doped P and N layers, P-N-N junctions with heavily doped P and N layers, as well as heterojunctions. These devices all made use of amorphous silicon produced by glow discharge in silanes. Unfortunately the basic amorphous silicon devices disclosed by Carlson have numerous disadvantages. Thus P-I-N junctions made from amorphous silicon suffer from excessive light loss in the junction layers. Moreover, the built-in potential of such a junction is undesirably low because the Fermi levels of both the P and N materials are relatively far (0.2 to 0.3 electron volts) from their respective band edges.

It has been speculated that if the separation of the Fermi levels from the respective conduction and valence band edges can be reduced, there would be a consequent increase in built-in voltage. This would also result in an increase in the open circuit voltage of the cell formed by the use of variously doped materials, as well as an increase in the field strength of the intrinsic layer used in such cells. The result could be an improvement in carrier collection, together with the current and fill factor of the cell.

Accordingly, it is an object of the invention to increase the built-in voltage of semiconductive devices. A related object is to increase the built-in volgate of semiconductive devices fabricated from semiconductanes, including silanes and germanes. Another related object is to increase the built-in voltage of devices fabricated from amorphous semicondctors.

Another object of the invention is to decrease the light loss in semiconductor devices. A related object is to decrease light loss in the frontal layer of multi-layer semicondictive devices. Still another related object is to decrease the light loss in the frontal layer of multilayer silicon devices in which the body of the device is of intrinsic amorphous silicon.

Still another object of the invention is to enchance the doping of semiconductive layers. A related object is to decrease the ohmic contact resistance with doped semiconductor layers. Another related object is to reduce the resistive power loss in semiconductive devices, particularly those which employ a body of amorphous silicon.

SUMMARY OF THE INVENTION

In accomplishing the foregoing and related objects, the invention provides for preparation of a body of amorphous semiconductor which is combined with microcrystalline semiconductor layers. The semiconductor can be an element from Group IV of the Periodic Series, including alloys thereof. The amorphous semiconductor is desirably silicon or germanium.

In accordance with one aspect of the invention, the amorphous and microcrystalline semiconductors are formed by a glow discharge in a semiconductane, such as a silane or germane. It is particularly desirable for the silane or germane to be of an order greater than unity, such as a disilane or digermane. Such higher order silanes and germanes are designated as polysilanes and polygermanes.

In accordance with another aspect of the invention, the desired microcrystalline semiconductor is produced by a glow discharge in a semiconductane mixed with a gaseous member from Group O or Group IA of the Periodic Table. In the case of microcrystalline "p" layers the mixing gas is selected from Group I, particularly hydrogen. Conversely, in the case of microcrystalline "n" layers, the mixing gas is selected from Group O, particularly argon.

In accordance with a further aspect of the invention, microcrystalline layers of n type conductivity are prepared using a dopant gas including phosphine, arsine, stibine, hydrogen sulfide and hydrogen silicide. For p-type conductivity the dopant gas is desirably a boron hydride having the general formula $B_xH_y$ where x is 2 and y is 6, or a boron halide, such as boron trifluoride or boron trichloride.

DESCRIPTION OF THE DRAWINGS

Other aspects of the invention will become apparent after considering several illustrative embodiments, taken in conjunction with the drawings, in which.

DETAILED DESCRIPTION

Figure 1:
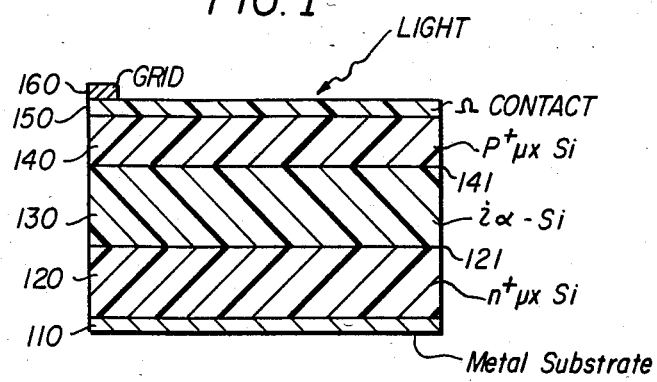
FIG. 1 is a schematic diagram of a double heterojunction device in accordance with invention.

With reference to the drawings, FIG. 1 shows a double heterojunction device 100 provided by a body 130 of intrinsic amorphous silicon sandwiched between two microcrystalline silicon layers 120 and 140.

The multilayer silicon assemblage 120,130 and 140 is positioned on a metal substrate 110 and is provided at the exposed surface of the upper layer 140 with a semi-transparent ohmic layer 150. The latter is in turn connected to a lead 160.

The lower layer 120 between the metal substrate 110 and the intrinsic body 130 is of n-type microcrystalline silicon. Conversely, the opposed layer, relative to the body 130, is of p-type microcrystalline silicon. The two layers 120 and 140 form heterojunctions 121 and 141 with the intrinsic body 130.

While the microcrystalline layers 120 and 140 are of opposite conductivity types in FIG. 1, it will be understood that other conductivity types may be used instead, including the reversal of conductivities. In all cases, however, the body of the device is of intrinsic material.

Microcrystalline layers, such as 120 and 140, are of the type generally defined in Veprek et al., J. de Physique, 42, C-4, 251 (1981). Microcrystalline materials have orders that range from between about 20 Angstrom units (the general upper limit for amorphous silicon) to about 500 Angstrom units (the conventional lower limit for regular crystalline silicon).

The heterojunction device 100 of FIG. 1 is characterized in having a double heterojunction formed by intrinsic and microcrystalline silicons. One of the junctions, 121, exists between the body 130 and the layer 120. The other heterojunction exists between the body 130 and the remaining microcrystalline layer 140.

The built in potential of the device 100 is increased above that of similar devices fabricated entirely using amorphous silicon. The reason is that both Fermi levels in the p- and n-layers 120 and 140 are closer to their respective band edges. In addition the heavy doping of the microcrystalline layers 120 and 140 reduces the amount of contact resistance.

Another consequence of the use of microcrystalline material in the device 100 is that there is less optical absorption in the layer 140 which results in an increase in the corresponding current in the body 130. There is correspondingly reduced absorption in the "back" layer 120 which results in increased reflection from the metal substrate 110 into the intrinsic body 130.

In particular the device 110 has enhanced built in voltage, lower reflection loss, and lower contact resistance than devices which employ a single microcrystalline layer.

Figure 2:
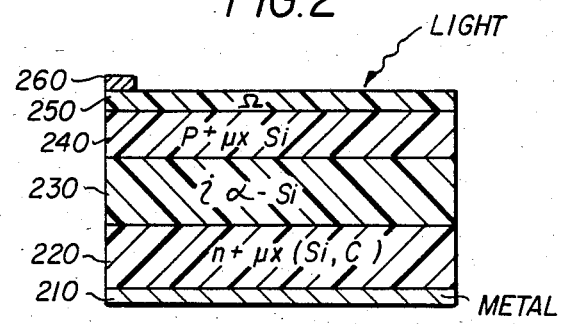
FIG. 2 is a schematic diagram of an alternative double heterojunction device in accordance with the invention.

In the embodiment of FIG. 2, a back junction layer 220 is employed in the overall device 200 using microcrystalline silicon carbide in place of ordinary microcrystalline silicon in the corresponding layer 120 of FIG. 1. The silicon carbide microcrystalline layer 220 has a greater bandgap and hence produces greater light reflection into the intrinsic layer 230. Microcrystalline silicon carbide is produced in the same fashion as microcrystalline silicon, with the addition of a hydrocarbon gas, e.g. of the alkane series to the etchant gas described below.

Figure 3:
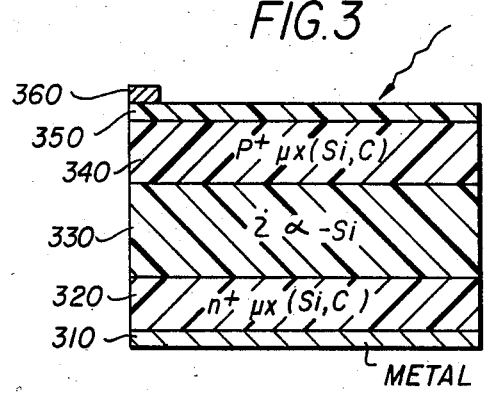
FIG. 3 is a schematic diagram of a further alternative double heterojunction device in accordance with the invention.

In the further embodiment 300 of FIG. 3, the top layer 340 employs p-type microcrystalline silicon carbide in place of the ordinary microcrystalline silicon layer 240 of FIG. 2. This provides less absorption in the front layer and hence allows more of the incident light to reach the intrinsic body 330. The overall result is a higher short circuit current than for the first two embodiments.

Figure 4:
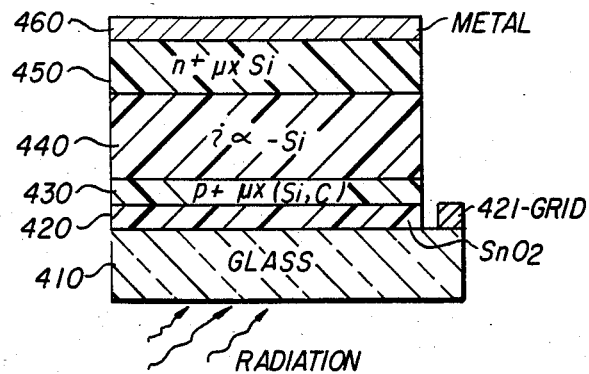
FIG. 4 is a schematic diagram of a second further alternative double heterojunction device in accordance with the invention.

In the fourth embodiment 400 of FIG. 4, only the front layer 430 is of microcrystalline silicon carbide. The remaining layers 440, 450 and 460 correspond to the layers 130, 120 and 110 of FIG. 1. The absorptive effect is enhanced by the inclusion of a tin oxide transparent conducting layer 420 between the front microcrystalline silicon carbide layer 430 and a glass cover 410. Here again, the microcrystalline silicon carbide has a higher bandgap than ordinary microcrystalline silicon. The result is a higher built-in voltage which is accompanied by a correspondingly higher open circuit voltage.

Figure 5:
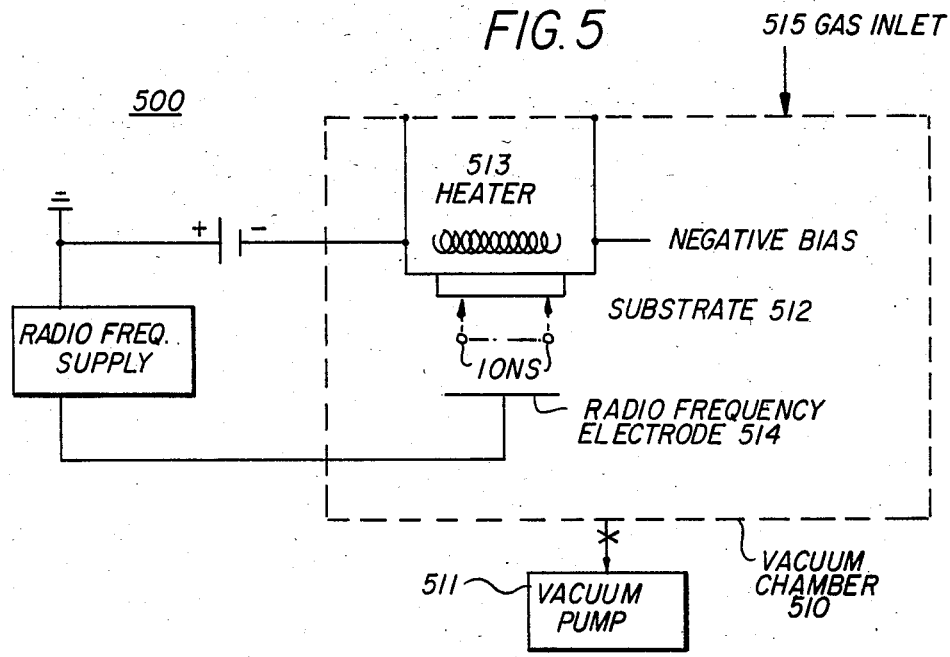
FIG. 5 is a schematic diagram of an arrangement for fabricating devices in accordance with the invention.

The fabrication of the foregoing heterojunction devices 100 to 400 can be achieved, for example, by the arrangement illustrated in FIG. 5. The reaction system 500 of FIG. 5 includes a reaction chamber 510 which is evacuated using a pump 511 to a vacuum in the range from approximately 100 microns to about 10 Torrs. Within the chamber is a substrate 512 which is maintained at a suitable temperature, for example, in the range from about 200 to 500 degrees Centigrade, using a heater 513. A radio frequency voltage electrode 514 is positioned within the chamber 510 at a suitable distance from the substrate 512 so that a semiconductane gaseous stream applied at an inlet 515 is converted into ions I which cause the deposition of glow discharge silicon on the substrate. The desired radio frequency voltage originates at a source 516 which is operated at a suitable frequency and voltage to produce a plasma discharge in the chamber 510.

The microcrystalline layer is produced during deposition by ion etching, i.e. with argon in the case of $n^+$ amorphous silicon films. The argon etching results in the formation of a microcrystalline film from the amorphous silicon film. In an illustrative embodiment the semiconductane was silane ($SiH_4$) with argon as the etchant. The ratio of silane to argon was about 1 to 20 or less. The deposition temperature was about 305° C. and the pressure was about 1 Torr. The ratio of the phosphine dopant (to produce the n characteristic) to silane was on the order of 4%. Etching was accomplished with a voltage in the range from about $-50$ to about $-100$ on the substrate. As the voltage increased the film growth decreased. As the radio frequency power increased the growth decreased. The result was suitable etching leading to increased conductivity, which was about 1000 times higher than for comparable amorphous silicon.

To form the $p^+$ microcrystalline film, etching was accomplished using hydrogen ions, for example using DC cathodic films. The result was a microcrystalline deposit having a conductivity on the order of 10, by comparison with the usual conductivity of $10^{-3}$ for p type amorphous silicon.

While various aspects of the invention have been set forth by the drawings and specification, it is to be understood that the foregoing detailed description is for illustration only and that various changes in parts, as well as the substitution of equivalent constituents for thos shown and described may be made without departing from the spirit and scope of the invention as set forth in the appended claims.

What is claimed is:

1. A semiconductor device comprising a body of amorphous semiconductor sandwiched between two doped microcrystalline semiconductor layers of opposite types of conductivity.

2. Device of claim 1 wherein said amorphous semiconductor is an element from Group IV or alloys thereof.

3. Device of claim 1 wherein said microcrystalline semiconductor layers are selected from a class containing Group IV elements or alloys thereof.

4. Device of claim 1 wherein at least one of said microcrystalline semiconductor layers has a bandgap higher than the bandgap of said amorphous body.

5. Device of claim 1 wherein the amorphous semiconductor body is undoped or lightly doped.

6. Device of claim 1 wherein the semiconductor device is provided with ohmic contacts on the free surface of each doped semiconductor layer.

7. Device of claim 6 wherein one of said ohmic contacts is semi-transparent to optical radiation.

* * * * *